United States Patent [19]
Bitler et al.

[11] 4,344,064
[45] Aug. 10, 1982

[54] ARTICLE CARRYING A DISTINCTIVE MARK

[75] Inventors: Joel R. Bitler, Allentown; Michael W. Bodnar, Macungie; Raymond H. Booth, Walnutport; Daniel J. Roman, Bethlehem; Fred J. Schneider, Northampton; Philip W. Seitzer, Bethlehem; George F. Wilkinson, Jr., Northampton, all of Pa.

[73] Assignee: Western Electric Co., Inc., New York, N.Y.

[21] Appl. No.: 101,042

[22] Filed: Dec. 6, 1979

[51] Int. Cl.³ .......................................... H01C 13/00
[52] U.S. Cl. ................................. 338/334; 338/295; 338/332; 338/333
[58] Field of Search ........ 338/195, 295, 320, 307–309, 338/332, 333, 334; 361/402; 219/521, 121 LH, 121 LJ; 29/620

[56] References Cited

U.S. PATENT DOCUMENTS

| | | | |
|---|---|---|---|
| 3,386,011 | 5/1968 | Murray, Jr. et al. | 361/402 |
| 3,458,687 | 7/1969 | Cranch | 219/521 |
| 3,623,603 | 11/1971 | Casner | 209/74 |
| 3,758,745 | 9/1973 | Wilker et al. | 219/121 LJ |
| 3,772,769 | 11/1973 | Rigby | 29/574 |
| 3,930,304 | 1/1976 | Keller et al. | 338/195 |
| 3,950,843 | 4/1976 | Hortan | 29/574 |

OTHER PUBLICATIONS

J. Dupcak et al., *The Western Electric Engineer*, Jul. 1974, vol. 18, No. 3, pp. 18–25.

Analog LSI Test/Trim Systems, *Solid State Technology*, Sep. 1979, pp. 44–45.

J. J. Friend, et al., Star: A Universal Active Filter, *Bell Laboratories Record*, Sep. 1979, pp. 232–236.

*Primary Examiner*—C. L. Albritton
*Attorney, Agent, or Firm*—W. O. Schellin

[57] ABSTRACT

A Hybrid Integrated Circuit package (11) typically includes a circuit substrate or article (12) on which are formed thin film components (17, 18, 19) of a circuit (22) and to which is bonded at least one semiconductor chip (21). Prior to bonding the chip (21) to the article (12) the circuit (22) undergoes various tests and adjustment operations. An electric element, preferably a resistance element (36), is formed on the article (12). The element (36) is functionally independent of the circuit (22) on the article (12). A first, initial value of the element (36) marks the article (12) as belonging to a first group of articles having first circuit characteristics. The initial value of the element (36) is selectively altered to a second value upon a determination that the article (12) has circuit characteristics other than those of the first group. In the described preferred embodiment the first group is a group of electrically acceptable articles (12), while other characteristics are those of defective articles. The mark is typically altered by a current of sufficient magnitude to burn portions of the element (36), or by selective application of radiant energy such as a laser beam (83). Identifying the altered mark permits articles (12) having defective circuits thereon to be selectively eliminated from further processing steps.

5 Claims, 8 Drawing Figures

ARTICLE CARRYING A DISTINCTIVE MARK

TECHNICAL FIELD

This invention relates to an article carrying a distinctive mark, and to methods of identifying such article. In particular, the invention relates to an electronic article which carries a distinctive mark in the course of being manufactured and assembled into an electronic component. The distinctive mark may be used, for example, to evidence that the article has passed certain qualifying tests as a prerequisite for the further processing of the article. The methods herein relate to the selective identification of articles depending on whether or not such a distinctive mark thereon has been altered.

BACKGROUND OF THE INVENTION

A problem in making "Hybrid Integrated Circuits" or HICs relates to cost-effectively combining two components from distinct groups, namely, film elements and semiconductor circuits. When the two components are combined to form a single package, each carries with it the cost of its entire production process. In making the components, a few components in each group tend to be defective. To minimize the cost of the assembled packages, it becomes desirable to ensure that good components of the one group are not combined with defective ones of the other group, such that only functional components are combined with each other. Testing of electrical components and sorting out those which are defective proceeds most economically on an automated basis. Automated testing and sorting methods for semiconductor chips are available and have been applied for some time. However, even though partly automated testing of such articles as film circuits carried by ceramic substrates is also available, heretofore, defective ones of such articles have generally been identified and sorted out by an operator.

In the manufacture of an article, such as a thin film circuit carried by a ceramic substrate, circuit pattern forming steps are typically followed by routine adjustment and testing operations before components such as the semiconductor chips are mounted to the article. Such adjustment and testing are typically executed by sophisticated equipment having capabilities of automatically adjusting or of testing a group of such articles arranged in an array on a single ceramic substrate. The results of tests as to whether the articles meet specifications are shown on indicator arrays. Indicators in such arrays correspond in their positions to the positions of the array of articles on the substrate.

A typical duty of an operator includes reading off positions of lighted indicators in such indicator arrays and marking corresponding circuit substrates in the array on the single ceramic substrate as being defective. The marked substrates are then omitted from a bonding operation during which the chips are combined with the articles. Occasional errors occur when an operator inadvertently marks an acceptable article as being defective instead of marking the article which the indicator array shows as being defective. Such an error not only decreases the yield of the manufacturing process but also permits a defective article to remain in the process sequence. It is therefore desirable to automate marking of any defective articles.

But even if the articles are automatically marked as being defective, operators still have to eliminate such marked articles from further processing steps. A continued inclusion of such marked articles in further processing steps is time consuming and unnecessarily costly. It is therefore desirable to automatically identify such marked articles to permit them to be automatically eliminated from the processing sequence.

SUMMARY OF THE INVENTION

It is, therefore, an object of the invention to provide new and improved methods to mark an article, as for example a circuit substrate, for identification.

A further object of the invention is to provide an article with a distinctive mark or label to permit such article to be selectively identified.

Another object of the invention is to mark an article by an application of energy and then to electrically identify such marked article.

Still another object of the invention is to eliminate a manual identification and deletion of defective articles in order to keep such defective articles from being assembled in an automatic assembly apparatus, thereby streamlining the automated assembly of acceptable articles.

Accordingly, the invention pertains to an article carrying a distinctive mark, the mark including first and second electrical terminals and an electrical element extending between such terminals, the electrical value of the element being indicative of a classification of the article into one of at least two classes.

BRIEF DESCRIPTION OF THE DRAWING

Other features and advantages will become apparent from the detailed description below when read with reference to the accompanying drawing, wherein.

DETAILED DESCRIPTION

The Product

Figure 1:
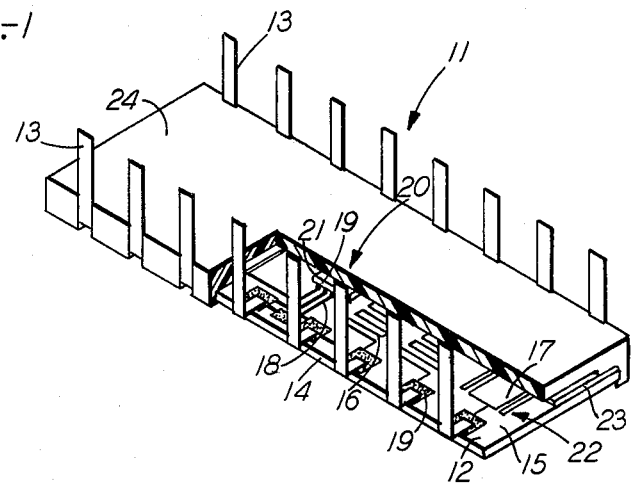
FIG. 1 is a pictorial representation of a Hybrid Integrated Circuit package including a circuit substrate as a typical article to which the present invention applies.

FIG. 1 depicts a Hybrid Integrated Circuit (HIC) package which is designated generally by the numeral 11. Such a HIC package 11 is a typical example of the type of product to which the invention advantageously applies. However, as it will become apparent from the further description of the invention, many advantageous features of the invention are applicable to various other products as well.

The package 11 typically includes a film circuit article 12. The article 12 in being a major structural component of the package 11, typically determines by its size the overall size of the package 11. Leads 13 are typically bonded to and extend from two opposite major edges 14 of the article 12. In the preferred embodiment of FIG. 1 the leads 13 are shown as being shaped into a typical Dual Inline Package (DIP) configuration, however, such a configuration is shown for illustrative purposes only, and any particular configuration or location of the leads 13 has no bearing on the invention.

The article 12 in being a typical support for thin film circuits is of a fine particle ceramic material, such as alumina, to provide a desirable smooth texture on a surface 15 on which typical circuit elements, such as resistors 16 and capacitors 17 are formed by known vapor deposition or sputtering techniques. The resistors 16 and capacitors 17 are typically interconnected by suitable lengths of conductor elements 18. Selected conductor elements 18 terminate in bond pads 19 along the edges 14. Others of the pads 19 are located in clusters about a central location 20 at which a semiconductor chip is mounted. The bond pads 19 along the edges 14 support the leads 13, while the clustered pads 19 serve as terminals for interconnecting the chip 21. In the preferred embodiment the chip 21 is a beam lead chip which is actually mounted to the article 12 by its beam leads. While the package 11 described herein is shown as having only a single chip 21, the number of such chips 21 on any one substrate 12 should not be considered to have a bearing on the scope of the invention.

A complete circuit 22, including the typical patterned structure of the described elements on the article 12 and the bonded chip 21, is then preferably protected by a layer 23 of a known room temperature vulcanizing (RTV) compound, such as one known as Silastic. An additional protective cap 24 of molded thermoplastic material, is then preferably applied over the layer 23 to give further support to the leads 13 and build the thickness of the package 11 to the thickness of other molded dual-in-line packages.

Forming the Articles Including a Distinctive Mark

Figure 3:
FIG. 3 is a diagram showing steps of manufacturing an article such as a circuit carrying substrate as a component of the package shown in FIG. 1.
Figure 3:
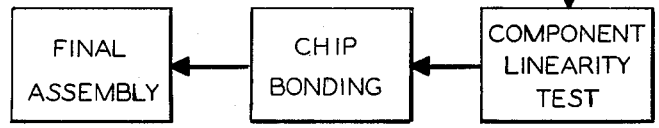

FIG. 3 is a flow diagram of a sequence of major manufacturing operations or processing steps which lead to the assembly of the article 12 into the package 11. Circuit forming pertains to forming, on the surface 15 of the article 12, patterned films of conductive and insulative materials which make up the desired elements of the circuit 22. According to well establish manufacturing techniques, a predetermined number of the articles 12 are formed simultaneously adjacent one another in an array 27 on a single, relatively large ceramic substrate 28 (see FIG. 5). Ultimately, the substrate 28 is laser scored or scribed along the boundary of each of the articles 12, and the substrate 28 is physically divided into the individual articles 12 by breaking the substrate 28 along the applied laser scribe lines.

The circuits 22 on the array 27 of the articles 12 are formed by typical, photolithographic techniques including selective exposure of photoresists and selective etching of deposited films. The present invention is described herein in relationship to typical thin film circuits. The films of such circuits 22 are preferably deposited by sputtering processes, however, vapor deposition techniques or plating processes are in some instances considered to be suitable alternatives. If, however, instead of the thin film circuit, a thick film circuit is preferred, a suitable thick film screening and firing operation would, of course, be substituted for the typical thin film forming techniques.

The conductors 18 of the thin film circuits typically comprise a deposited layer of gold. The resistors 16 are typically formed of tantalum nitride. The capacitors 17 typically have a layered structure of a tantalum film, a tantalum oxide film formed on the tantalum film, and an upper conductive film of gold. In accordance with typical thin film forming techniques, all like components on all articles 12 in the array 27 are formed simultaneously.

Figure 2:
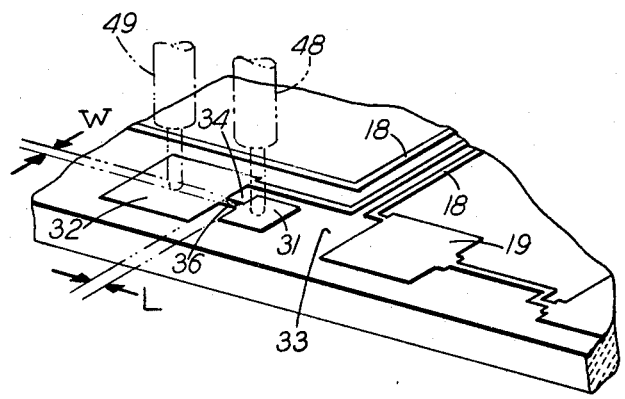
FIG. 2 is an enlarged view of a portion of the circuit substrate or article of the package in FIG. 1, the view highlighting certain features of the invention.

Referring to FIG. 2, there is shown, in addition to the previously described typical elements, a supplementary test pad 31 adjacent to one of the bond pads. The bond pad also serves as a special terminal pad in accordance with this invention and is as such separately designated by the numeral 32. Of course, the bond pad 32 could conceivably be a separately formed pad as the test pad 31. However, space considerations make it desirable to use one of the already existing bond pads 19 as the terminal pad 32. The test pad 31 is preferably of the same thickness as the material and thickness of the other pads 19 including the terminal pad 32. Such correspondence in material type and thickness permits the test pad 31 to be formed simultaneously with the pads 19 and 32. The size of the test pad 31 is maximized within the available space between the pad 32 and an adjacent one of the pads 19, allowing, however, an insulating gap 33 of appropriate width between the pad 31 and other adjacent metallization patterns.

The width of a gap 34 between the test pad 31 and the terminal pad 32 is held to a precise dimension within practical tolerance limits. The width of the gap 34 establishes the length of a resistive element 36 which is formed between the pads 31 and 32 and which bridges the gap 34. The element 36 is also preferably of the same material type and thickness as, and is typically formed simultaneously with, the resistors 16 on the substrate 12.

Both the length and the width of the resistive element 36, which are identified in FIG. 2 by the letters "L" and "W", respectively, are kept to practical minimums consistent with current pattern forming standards. A preferred dimension for both the width and the length is 0.05 mm. Minimizing the lateral dimensions of the resistive element 36 advantageously limits the power carrying capacity of the element 36. Minimizing the power carrying capacity is advantageous for altering the resistance of the element 36 through the application of energy as will be described hereinafter.

The resistance of the element 36 is initially established by the ratio of its length to its width and by a factor determined by the type of material of the element and by the thickness to which such material is deposited on the article 12. The material of the resistive element 36 is preferably tantalum nitride, such being the same material as that of the resistors 16 on the substrate 12. The thickness of the resistive element is also preferred to be the same as that of the resistors 16. The correspondence of both, material type and thickness of the element 36 with those of the resistors 16, permits the resistive element 36 to be formed simultaneously with the resistors to integrate the formation of the resistive element 36 into the typical process for forming the circuit 22.

In the absence of additional processing steps for adding the test pad 31 and the resistive element 36 to the typical, prior art circuits on the articles, cost increases between making the present circuit 22 and a similar prior art circuit are negligible. The resistor material is deposited to a thickness within a preferred range of 350 to 400 Angstrom units. Such a thickness is usually controlled so as to result in a typical resistance of the element 36 of approximately 300 ohms. Typical variations in the comparatively small lateral dimensions of the element tend to cause deviations of up to 100 ohms in both the positive and the negative direction from the normal value of the element 36.

The powder carrying capacity of the resistive element 36 is minimized by its size. Consequently, a current of 90 milliamps is found capable of significantly altering the resistivity of the material of the element 36. The application of such a current through the element 36 almost instantaneously changes its resistance from the initial value of approximately 300 ohms to a value which in most instances represents for practical purposes an open circuit. An altered resistance value is typically specified as being greater than 8000 ohms. The change in resistance between the initial and the altered value has been found to be typically greater than the 8000 ohm value and to approach the 8000 ohm value from the high resistance end only in a few instances.

The resistive element 36, by displaying one of two states, namely, an initial, low resistance state and an altered, high resistance or open state, becomes a distinctive mark on such article 12. The mark is capable, in the preferred embodiment, of labeling the article 12 as belonging to one of two distinct groups of articles. The initial and the altered states are applied respectively to those of the articles 12 which meet process requirements and to those which have been determined to be defective. The resistive element 36 thereby becomes an effective status indicating mark for each of the articles 12.

The article 12 carries the distinctive mark which identifies such article as being acceptable from the time the circuit 22 is formed thereon. As long as the article 12 is considered to be acceptable, the element 36 is maintained in its initial state. If during any subsequent process steps the article 12 is found to deviate from any desirable standards, hence to be defective, the resistance of the element 36 is altered to the high resistance state to permit such article to be identified as defective in future process steps.

Selectively Marking the Articles

Articles 11, the circuits 22 of which are found to be defective during a capacitor leakage current test, which follows forming the circuits 22 (see FIG. 3), are automatically marked to label them distinctly from those which pass the capacitor leakage current test. The capacitor leakage current test itself is a known, well established prior art procedure. A typical test apparatus for the test is commercially available from General Radio Company.

Figure 8:
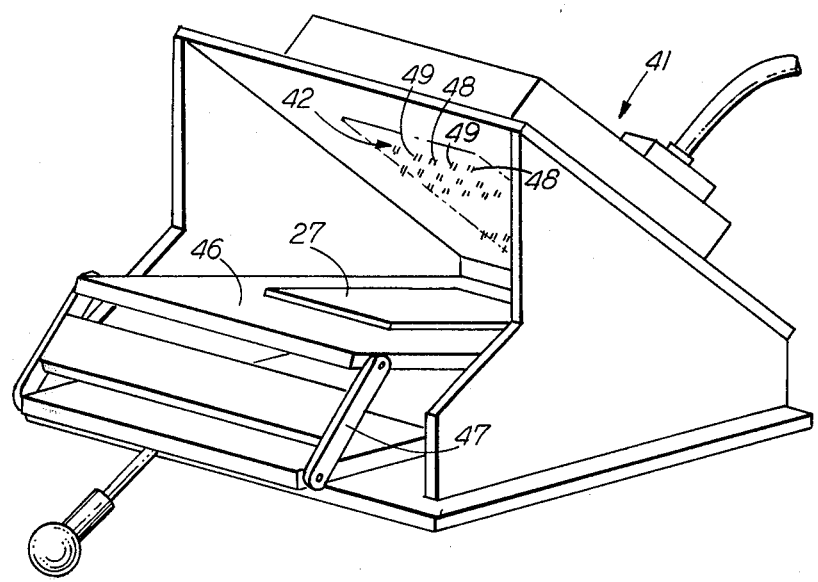
FIG. 8 shows a typical apparatus for contacting an array of articles to identify distinctive marks on the articles of the array in accordance with the present invention.

According to prior art practices the array 27 is placed into a holder similar to a holder 41 shown in FIG. 8. In such a holder a plurality of contact pins 42 are typically located in predetermined positions with respect to a locating nest 46. The pins 42 typically are axially resilient, spring biased pins which are also referred to as telescoping pins. The array 27 is placed into the nest 46 in a predetermined orientation with respect to the pins 42. FIG. 8 shows a hinged clamping mechanism 47 which is then operated to advance the array 27 relative to the pins 42 toward, and into contact with, predetermined measuring or contact points (such as the pads 19) on each of the articles 12 on the array 27. In general, any of a number of similar clamping mechanisms may be used to advance the articles 12 toward the pins 42.

The holder 41 shown in FIG. 8 is therefore representative of similar holders 41 which may be used in conjunction with the capacitor leakage current test. The typical hinged clamping mechanism of FIG. 8 is particularly used in conjunction with a chip bonding operation, as will be described hereunder. However, in each instance the holder 41 has been modified over typical prior art holders to feature either in conjunction with the typical pins 42 or in the absence of such pins 42 a specially positioned pair of contact pins 48 and 49 for each of the articles 12 in the array 27.

Preferably the pins 48 and 49 are of the same type as the other contact pins 42 which may be used in the typical holder 41. The pins 48 and 49 are particularly positioned in the holder 41 to contact the pads 31 and 32, respectively, as shown on an enlarged scale in phantom lines in FIG. 2.

The results of the capacitor leakage current test are typically displayed by an indicator panel 51 (see FIG. 4) on which an array of indicators 52 correspond in arrangement to the array 27 of the articles 12. By selectively lighting a particular one of the indicators 52, the panel 51 identifies one of the articles 12 which corresponds in position to that of the lighted indicator 52 as being defective.

Figure 4:
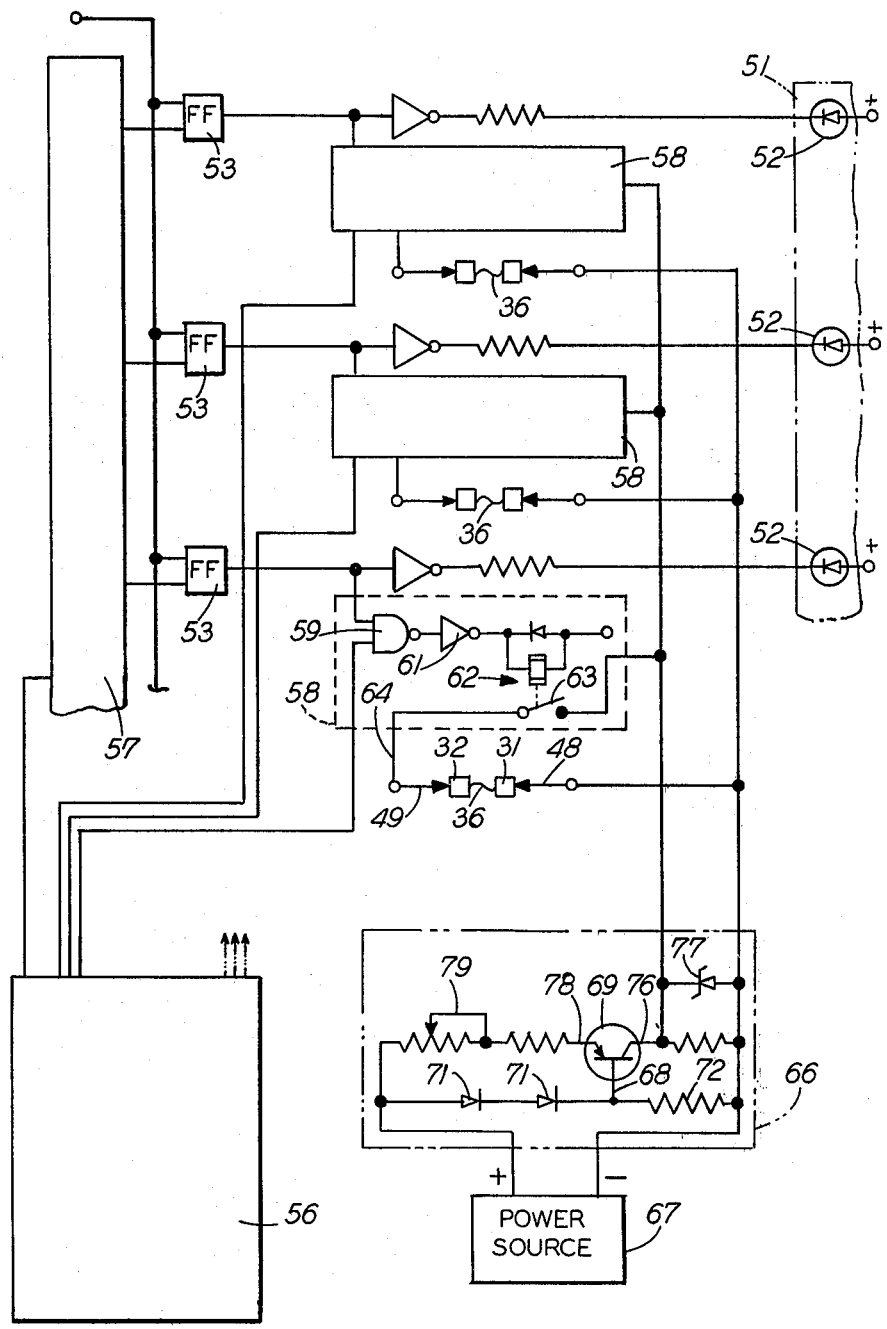
FIG. 4 is a circuit diagram showing certain features of the invention and highlighting a current limiting circuit which is advantageously used for marking selected articles in accordance with the invention.

FIG. 4 is a schematic circuit diagram in which three of the indicators 52 are shown as a representative number of the indicators in the panel 51. Consequently, the schematic diagram in FIG. 4 shows only a portion of the panel 51. The indicators 52 are typically light emitting diodes which are powdered through a conventional amplifier circuit. The operation of each of the indicators 52 is controlled by the output state of a flip-flop 53.

In a distinct deviation from the prior art apparatus, a clock-counter circuit 56 is activated by an end of test pulse from a control console 57. The clock-counter circuit 56 upon being activated sequentially applies an activating pulse to each of a number of switching circuits 58. Each of the switching circuits 58 is controlled by a respective input from the clock-counter circuit 56 and by a signal from the output of one of the flip-flops 53. The two inputs are gated through a typical nand-gate 59 to control the output of a relay driver amplifier 61. The amplifier 61 controls the operation of a relay 62.

As the relay 62 of one of the switching circuits 58 becomes activated, a contact 63 thereof establishes electrical continuity from an output 64 of a constant current circuit 66 through a respective one of the resistive elements 36 to ground. The activation of the relay 62 is determined by whether or not the flip-flop 53 corresponding to the substrate 12 of the particular element 36 is set to indicate that the respective substrate 12 is defective.

The constant current circuit 66 is also referred to as a marking circuit 66. Powered by a typical power supply 67 of preferably 40 volts the marking circuit 66 is capable of providing an output of a constant current of limited magnitude. In the circuit 66, a base terminal 68 of a p-n-p transistor 69 is biased through diodes 71 and a bias resistor 72 to a potential of substantially 1.4 volts below that of the positive terminal of the supply 67. A collector terminal 76 is coupled to ground through a 33-volt zener diode 77. An emitter terminal 78 of the transistor 69 is coupled through an adjustable resistor 79 to the positive terminal of the supply 67. The resistor 79 is adjusted to provide a constant current output of 90 milliamps through the transistor 69.

The current flowing through the resistive element 36 as a result of the closed contact 63 of the relay 62 instantaneously changes the physical and electrical characteristics of the resistive element 36. Such changes show a consistent increase of the resistance through the resistive element 36 to a value which is typically much greater than its initial value. In the preferred process sequence a value of 8000 ohms has been established as a discriminating value with sufficient safety margin to distinguish between the initial value and the changed or altered value of the resistive element 36.

To protect the circuit 22 on the article 12 from being affected by a current pulse from the marking circuit 66 during the time when the resistance of the element 36 is being altered, the terminal pad 32 is preferably selected to be coupled to a bias terminal lead for the chip 21 on the article 12. Thus, prior to the chip bonding operation the terminal pad 32 is still separate from the circuit 22 and has no function other than serving as a terminal for the resistive element 36. Until after the chip 21 has been bonded to the article 12, the test pad 31 and the terminal pad 32 are contacted by the pins 48 and 49 only for measuring or for altering the resistance of the element 36.

The marking circuit 66 has been described in detail in its function in relationship to the capacitor leakage current test. An identical marking circuit 66 (see FIG. 5) is applied to selectively mark defective articles 12 as they become identified as being defective during a laser trim operation and in the course of a component linearity test.

The Laser Trim Operation

The laser trim operation typically follows the capacitor leakage current test as shown in the diagram of FIG. 3. During the laser trim operation, which is performed by commercially available laser trim equipment, portions of patterns of the form resistors 16 are selectively burned away to alter current flow patterns through the remaining portions of the resistors 16 and thereby increase the resistance of the resistors 16. Typically, the resistors 16 are concurrently adjusted and tested. In the preferred method the adjustment of the resistors 16 is typically preceded by measuring the value of the capacitors 17 and computing target values for the resistors 16 to which the laser trim operation will adjust the resistors 16. Commercially available equipment includes data reduction circuits (not shown) to obtain and store such target value for each of the resistors. Such target values are input variables or instructions in an operating program for a laser trim apparatus 81 (see FIG. 5) which automatically selects predetermined areas of resistor material to be burned away to achieve the desired characteristics for the circuit 22 on each of the articles 12.

The operating program which is processed by a control module 82 of the laser trim apparatus 81 also includes instructions for advancing the laser trim operation sequentially from one of the articles 12 in the array 27 to the next. In the past location data on the defective articles 12 had to be supplied to the control module through keyboard entries of alpha-numeric character combinations which corresponded to row and column positions of the defective articles 12 in the array 27. In accordance with this invention, defective articles 12 in each array 27 are identified as the laser trim operation is being advanced to the next article 12.

Figure 5:
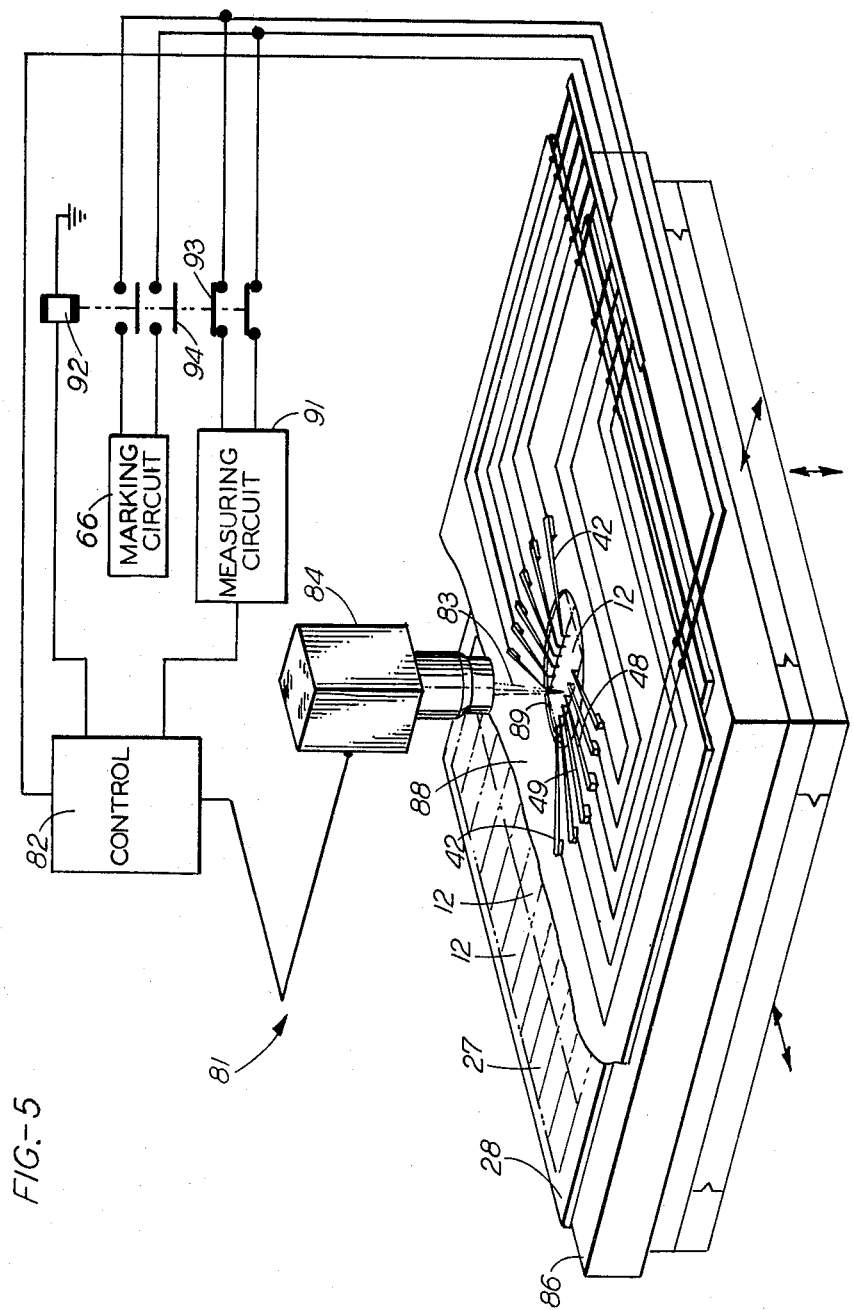
FIG. 5 shows an array of articles located on a work table of typical adjustment apparatus to which the invention advantageously applies.

FIG. 5 shows the laser trim apparatus 81 in a schematically simplified manner. Typically, the control module 82 operates and steers a laser beam 83 emitted from a laser head 84. The module 82 causes the beam 83 to selectively turn on and impinge upon predetermined areas of one of the substrates 12 of the array 27. An alignment table 86 is capable of controlled movement along three orthogonal axes as indicated by the arrows in FIG. 5. After the array 27 is placed on the table 86 and aligned according to typical alignment procedures the control module 82 indexes the table 86 to align the articles 12 in the array 27 sequentially within a typical scanning range of the laser beam 83.

After each index operation the table 86 executes a vertical movement to move selected pads 19 or other measuring points into contact with pins 42. As shown in FIG. 5, on the laser trim apparatus 81 cantilever pins are preferred over the typical telescoping type pins, such as those shown in phantom lines in FIG. 2. However, the function of such cantilever type pins is the same as the function of the telescoping type pins, and in some instances the telescoping type pins 42 may be used with respect to the laser apparatus. Consequently the same numerals are assigned to both types of pins.

Identifying Defective Articles

Referring to FIG. 5, the pins 42 on the apparatus 81 are typically mounted to a circuit board 88 in fixed relationship to the laser head 84, and extend through a central opening 89 on the periphery of the scanning area of the beam 83 toward the article 12. Also mounted on the board are the cantilever type pins 48 and 49 which contact the pads 31 and 32 on the article 12 after each indexing and vertical movement of the table 86.

The pins 48 and 49 are coupled to a resistance measuring circuit 91. In FIG. 5 the resistance measuring circuit 91 is shown separately from the control module 82. However, the control module 82, as a component part of the apparatus 81, already includes typical resistance measuring circuits, similar to the circuit 91. It is, therefore, possible and may even be desirable to couple the contact pins 48 and 49 to such resistance measuring circuitry within the module 82 to permit such circuitry to function in lieu of the circuit 91 in accordance with the following description.

As the table 86 completes an indexing movement to align one of the substrates 12 in the array 27 with the scanning area of the laser beam 83, the module 82 immediately polls the circuit 91 to ascertain the state of the resistance of the element 36 on the article 12 which has just been indexed into alignment with the scanning area of the laser beam 83. If such poll indicates that the substrate is marked as being defective, namely that the resistive element 36 has been altered, the module 82 immediately causes the table 86 to index to align the next article 12 with the scanning area of the laser beam. Thus, the laser beam is not operated and consequently no trimming takes place on any defective article 12.

If, however, the resistance of the resistive element 36 indicates that the substrate 12 has not been marked as being defective, the laser trim operation of the resistors 16 proceeds in accordance with the program instructions in the control module 82. During such trim operations the measuring circuits within the control module 82 monitor the resistors 16 through the contact pins 42. If at any time during such trim operations a defective circuit 22 is created or found to exist, the control module 82 takes steps for making the respective article as being defective. Typically, the unit pulses a relay 92.

As shown in FIG. 5, the relay 92 typicaly controls two contact pairs, 93 and 94. The contact pair 93, which is normally closed, couples the contact pins 48 and 49 to the measuring circuit 91 as long as the relay 93 remains de-energized. Pulsing the relay 92 decouples the measuring circuit from the pins 48 and 49. The contact pair 94 closes shortly thereafter and couples the already described marking circuit 66 to the pins 48 and 49 for a time period which is preferably slightly in excess of 10 milliseconds. Such a time period is sufficient for the marking current to pass through the pins 48 and 49 to increase the resistance of the resistive element 36 and thereby mark the respective article 12 as being defective.

It should be pointed out that the contact pair 93 must open prior to the time at which the contact pair 94 closes, and close after the contact pair 94 opens to protect the measuring circuit 91 from becoming coupled to the marking circuit. After marking the article 12 as defective, the measuring circuit 91 is again coupled to the pins 48 and 49, and the table 86 indexes to align the next article 12 in the array 27 with the scanning area of the beam 83.

The laser trim operation permits through its capability of selectively burning resistive material off the surfaces of the article 12, an alternate method of marking the article 12 as defective. Instead of energizing a relay, such as the relay 92, the control module 82 may be programmed to direct the laser beam to the location of the resistive element 36 to burn the resistive element and thereby alter its resistance upon an indication that the circuit 22 on the substrate 12 cannot be trimmed to the desired characteristic and, hence, that the substrate 12 is defective. Such a program variation eliminates the need for the marking circuit 66 and for the relay 92. However, the pins 48 and 49 are nevertheless found to be desirable.

The Component Linearity Test

Component linearity testing, which preferably follows the laser trim operation as shown in FIG. 3, is typically performed by commercially available test equipment. In that the component linearity test is a final test of the circuit 22 on the article 12 before the chip 21 becomes bonded thereto, additional final quality tests are typically combined with the component linearity test. Linearity testing itself involves applying a signal of a fundamental frequency to the resistors 16. All frequencies except for a third harmonic of the fundamental frequency are then filtered and the third harmonic is compared to a predetermined desirable signal value. Other tests typically include a resistor value check and an isolation test between the various elements of the circuit 22.

The handling provisions of the component linearity test are substantially like handling provisions of the laser trim apparatus 81 shown in FIG. 5. Typically, a contact pin arrangement such as the one formed by the pins 42 on the circuit board 88 is mounted with respect to an index table such as the alignment table 86. Similarly to the apparatus 81, the component linearity test set includes the pins 48 and 49 which are normally coupled to the resistance measuring circuit 91. Typical test and control circuits are contained in a module such as the control module 82. Also, a relay such as the relay 92 activates the marking circuit 66 in the manner described in conjunction with the laser trim apparatus 81 if the component linearity test or any of the associated tests show any one of the articles 12 in the array 27 to be defective.

The component linearity test operates sequentially on the articles 12 in the array 27. The control module 82 causes the pins 42, 48 and 49 to be advanced to the next article 12 upon (1) completion of the test on the article 12, or (2) the identification by the test apparatus of a circuit 22 on the article 12 being defective.

As in the laser trim operation, immediately upon one of the articles 12 in the array 27 becoming aligned with the pins 42, 48 and 49, the circuit 91 measures the resistance of the element 36 to determine whether or not the article in alignment with the pins is defective. If the article 12 is marked as being defective as evidenced by the resistance of the element 36 having been altered, the pins 42, 48 and 49 are immediately indexed with respect to the array 27 to align the next article 12 in the array 27 with the pins.

Also, upon an indication of the article currently under test being defective, the control module 82 activates the relay 92. Such activation couples the marking circuit 66 to the resistive element 36 to alter its resistance and to thereby mark the article 12 as being defective. It should be realized that the component linearity test by not having available the laser head 84, is not equipped for employing the alternate method of altering the resistive element 36 with the laser beam 83. Consequently, in the course of the component linearity test procedure coupling the marking circuit 66 through the pins 48 and 49 across the element 36 is the preferred method of altering the resistance of element 36.

The Chip Bonding Operation

Figure 6:
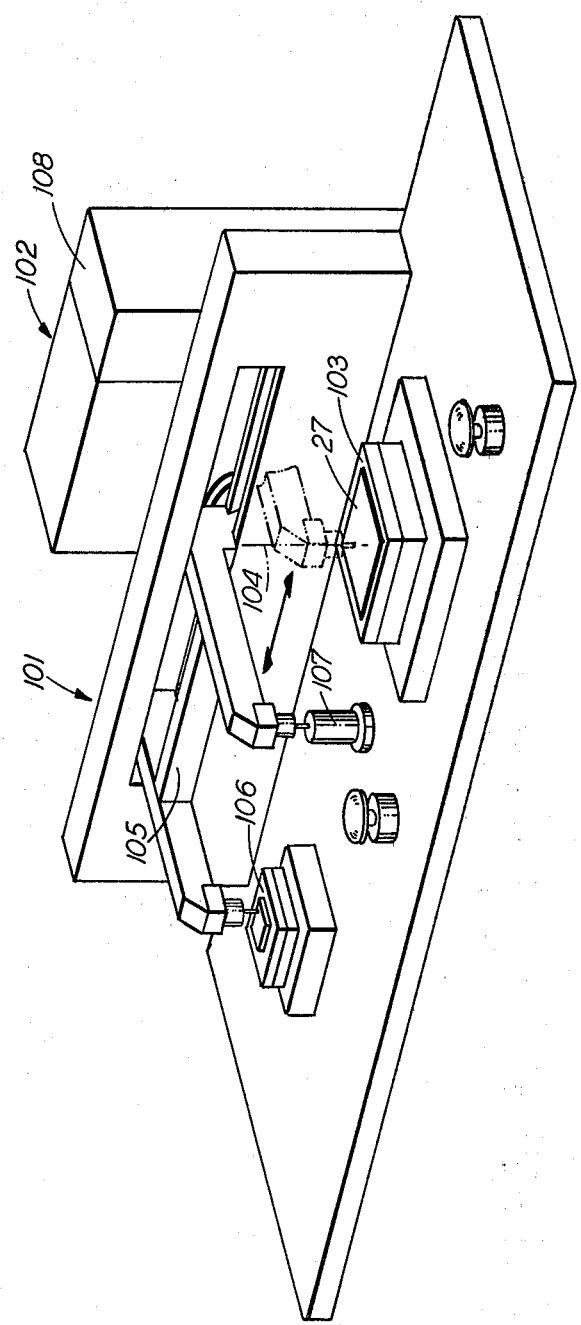
FIG. 6 is a pictorial representation of a typical assembly apparatus to which the invention applies.

After each of the articles 12 in the array 27 has been tested, the array 27 is advanced to the chip bonding operation. FIG. 6 shows typical bonding apparatus which is designated generally by the numeral 101. The bonding apparatus includes various features to assure fast and accurate mounting of each of the chips 21 to the respective articles 12. Like the laser trim apparatus 81, the bonding apparatus 101 includes a programmable control module 102. Typically, the apparatus indexes a bonding platform 103 to advance the articles 12 in the array 27 sequentially into alignment with a bonding axis 104.

In accordance with known practices, a typical dual transfer arm 105 picks up one of the chips 21 from a programmably indexed chip carrier table 106 and advances the chip 21 to a centering cavity 107. Simultaneously therewith a second portion of the arm 105 transfer another one of the chips 21 from the centering cavity 107 into alignment with the bonding axis 104, to bond such chip 21 to the article 12 at the bonding axis 104. Selectively, one of the articles 12 in the array 27 may be bypassed and not become aligned with the bonding axis 104, when such article 12 is identified by the apparatus 101 as being defective.

According to one possible embodiment, the contact pins 48 and 49 can be mounted on the apparatus 101 in fixed relationship to the bonding axis 104. The resistance of the element 36 can then be measured just prior to, or immediately after, indexing of the array 27 to align the article 12 with the bonding axis 104.

However, it is preferred to load one of the arrays 27 into the holder 41 such as is shown in FIG. 8. The holder 41, when used with the bonding apparatus 101, electrically communicates with the control module 102. The holder 41, as a signal input means to the control module 102 only needs to make electrical connections to the pads 31 and 32 through the respective pins 48 and 49 in alignment with each of the articles 12 in the array 27. At the chip bonding stage of the process sequence shown in FIG. 3, only the cumulative result of marking the article 12 at each of the described process steps needs to be identified.

The array 27 is loaded into the holder 41 and the pads 31 and 32 are advanced into contact with the pins 48 and 49 to identify any defective articles 12 in the array 27 before the array 27 is placed onto the bonding platform 103. Typically, the array 27 is loaded into the holder 41 while another array 27 of articles 12 is still located on the bonding platform 103 and subjected to the process of having the chips 21 bonded to its respective articles 12.

The control module 102 of the bonding apparatus 101 includes a typical memory and processing unit 108 for storing and selctively accessing control information. Data identifying defective articles 12 of the array 27 located in the holder 41 is preferably transferred to the unit 108 and stored therein at the completion of the bonding operation on the previous array 27.

Figure 7:
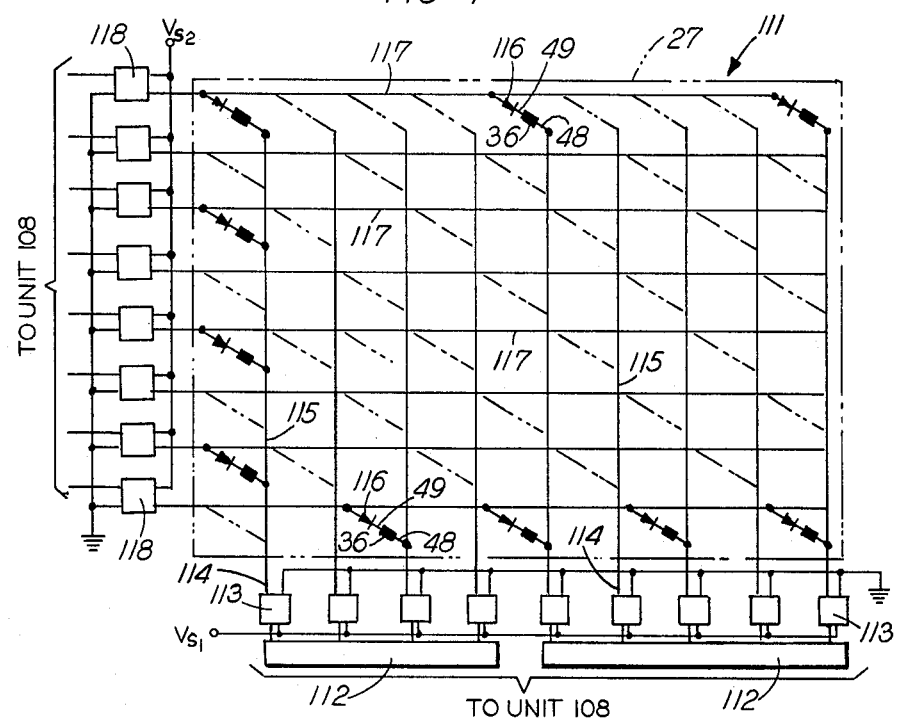
FIG. 7 is a schematic diagram showing an interface circuit for determining the state of identifying marks on an array of articles for identifying and sorting selected ones of the articles in the array prior to assembling such articles into the package of FIG. 1.

A preferred interface circuit 111 between the holder 41 and the memory and processing unit 108 is shown schematically in FIG. 7. A representative number of the elements 36 as they would be located on the respective articles 12 of the array 27 are coupled into the interface circuit 111 to permit the status of each of the elements 36 to be sequentially read into the memory and processing unit.

After placing the array 27 into the holder 41, the memory and processing unit 108 queries the interface circuit 111 by sending a sequence of multiplexed binary number or code pulses to a decoder 112. In response to the receipt of one of the code pulses, the decoder 112 energizes the input side of a corresponding one of a series of first opto-isolator switches 113 by coupling a first supply voltage $V_{S1}$ to ground. In becoming energized the switch 113 changes from a high to a low impedance state across its output terminals 114 and thereby couples one terminal of each element 36 of an entire column of the articles 12 in the array 27 through a particular column lead 115 to ground.

The other terminal of each element 36 in the ground-coupled column of the elements 36 is coupled through a diode 116 to a particular one of a series of row leads 117. Each row lead 117 is coupled through an input side of a corresponding one of a series of a second opto-isolator switches 118 to a second supply voltage ($V_{S2}$). A low resistance state of the resistive elements 36 in the array 27, causes a low resistance state across the output terminals of the corresponding switch 118. If, however, the resistance of the element 36 is at a high resistance or open state because the corresponding article 12 was found defective during any of the preceding tests, then the output of the corresponding switch 118 remains at a high impedance.

The memory and processing unit 108 sequentially samples the output impedance state of each of the switches 118 during each of the code pulses applied to the decoder 112. Code pulse as an address to the first switch 113 combined with a code signal for sampling the second switch 118 form a memory address for storing the data on the high or low impedance state of the sampled second switch 118. After all positions of the array 27 have been polled by sequentially energizing the first switches 113 and scanning through the second switches a corresponding number of times in the described manner, the array 27 is removed from the holder 41 and aligned on the bonding platform 103. Thereafter the bonding apparatus automatically bonds the chips 21 only to those articles 12 which the second switches 118 had indicated by their low impedance that the articles 12 had in fact successfully passed all described process steps. A typical microprocessor controlled switching sequence queries the memory of the unit 108 and advances the index table 103 past those articles 12, which according to data from the unit 108 are indicated to be defective.

In the particular described process sequence the bonding operation is the final operation during which the element 36 is preferred to be used as a distinguishing mark between such groups as acceptable and defective articles 12. In subsequent operations after the array 27 has been separated into individual articles 12, the presence of a bonded chip 21 is preferably used as an identification of an acceptable article.

However, in other similar processes, the element 36 can advantageously serve a useful function up to and even beyond a final assembly stage of typical articles. Such an identifiable distinguishing mark is seen to be advantageous, for instance, for selectively grouping different components having like shape but different functions, to permit such component to be automatically selected for mounting into a particular one of two or more predetermined circuit locations during fully automated assembly operations of electronic apparatus. To particular methods of identifying or classifying articles, it may, for instance, be advantageous to provide each article with a plurality of marks which may be altered and identified in accordance with features or methods described herein. Various other modifications and changes are deemed possible, of course, in both, details of the mark and in methods of identifying the mark without departing from the spirit and scope of this invention.

What is claimed is:

1. An electronic article, which comprises:
    a substrate;
    circuit elements supported by the substrate, said circuit elements including conductive leads connecting said elements into a circuit component capable of performing a circuit function with characteristic values within ranges of values, and first type terminals coupled to selected ones of such conductive leads and located in predetermined, spaced locations on said substrate, said first type terminals being adapted to connect said electronic article into a selected electric circuit; and
    at least one resistive element supported by said substrate, said at least one resistive element having one of two characteristic resistance value states separated by a predetermined threshold value, the value of said at least one resistive element indicating said circuit elements as having a functional output in a certain, predetermined range of values of at least two predetermined ranges of values, said at least one resistive element being coupled between two terminals supported by the substrate, at least one of said two terminals being a second type terminal which is not adapted to become coupled into said selected electric circuit, whereby the range of values of said functional output is embodied in the value of said at least one resistive element and is ascertainable by electrical measurement of said at least one resistive element without coupling said circuit elements into an electric measuring circuit for ascertaining said value of said at least one resistive element.

2. An electronic article according to claim 1, wherein said at least one resistive element thereof is one resistive element having one of two characteristic resistance value states indicative of whether said circuit elements are acceptable or at least one of such circuit elements has failed to meet a test.

3. An electronic article carrying a distinctive mark, which comprises:
   a substrate;
   circuit elements located on the substrate, said circuit elements including conductive leads interconnecting the elements into a component circuit, and first type terminals located in predetermined, spaced locations on the surface of the substrate, said first type terminals being electrically coupled to selected ones of said circuit elements and adapted to couple said component circuit into an electric circuit external to the substrate; and
   a special resistive element located on the substrate, and connected between terminals at least one of which is of a second type not adapted to become coupled into said electric circuit external to the substrate, said resistive element having a first resistance smaller than a predetermined threshold value to identify the article including said circuit elements interconnected into said component circuit as meeting predetermined specifications, said resistive element being adapted to be altered to a second resistance larger than said predetermined threshold value upon any of such circuit elements interconnected into said component circuit fail to meet predetermined specifications, whereby said resistive element is a mark for classifying said article into a first group of articles which are acceptable, said mark being electrically readable without coupling said circuit elements into an electrical measuring circuit.

4. An electronic article according to claim 3, the substrate thereof being a film substrate, at least one of said circuit elements being a resistor, and the special resistive element being formed of the same material, and being substantially of the same thickness, as the resistor on the substrate, and said at least one terminal of the second type connected to said resistive element being formed of the same material, and being substantially of the same thickness as said terminals of the first type.

5. An electronic article according to claim 3, the resistive element thereof having a limited current carrying capacity, such that said first resistance is alterable to said second resistance by a current of a predetermined magnitude applied through contact probes to said terminals at least one of which being of said second type, said second resistance being electrically identifiable as being distinct from said first resistance, said second resistance identifying the article as one of a second group of articles carrying at least one unacceptable element.

* * * * *

UNITED STATES PATENT AND TRADEMARK OFFICE
CERTIFICATE OF CORRECTION

PATENT NO. : 4,344,064

DATED : August 10, 1982

INVENTOR(S) : J.R. Bitler-M.W. Bodnar-R.H. Booth-D.J. Roman-
F.J. Schneider-P.W. Seitzer-G.F. Wilkinson, Jr.

It is certified that error appears in the above—identified patent and that said Letters Patent is hereby corrected as shown below:

Column 5, line 14, "powder" should read --power--. Column 6, line 38, "powdered" should read --powered--. Column 11, line 26, "selctively" should read --selectively--. In the claims, Column 13, claim 3, line 21, after "the" insert therefor --surface of the--.

Signed and Sealed this

Twenty-seventh Day of September 1983

[SEAL]

Attest:

GERALD J. MOSSINGHOFF

Attesting Officer     Commissioner of Patents and Trademarks